United States Patent
Park

(10) Patent No.: US 9,588,187 B2
(45) Date of Patent: Mar. 7, 2017

(54) METHOD AND APPARATUS FOR ESTIMATING BATTERY LIFE DURING DRIVING OF ELECTRICAL VEHICLE (EV)

(71) Applicant: Samsung Electronics Co., Ltd., Suwon-si (KR)

(72) Inventor: Sang Do Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 211 days.

(21) Appl. No.: 14/489,857

(22) Filed: Sep. 18, 2014

(65) Prior Publication Data

US 2015/0301121 A1    Oct. 22, 2015

(30) Foreign Application Priority Data

Apr. 21, 2014 (KR) ......... 10-2014-0047491

(51) Int. Cl.
*G01N 27/416* (2006.01)
*G01R 31/36* (2006.01)

(52) U.S. Cl.
CPC ...... *G01R 31/3679* (2013.01); *G01R 31/3662* (2013.01)

(58) Field of Classification Search
CPC ............ G01R 31/3679; G01R 31/3662
USPC ............................................ 324/430
See application file for complete search history.

(56) References Cited

U.S. PATENT DOCUMENTS

| | | | |
|---|---|---|---|
| 4,585,001 A * | 4/1986 | Belt ................. | A61N 1/365 327/89 |
| 6,847,906 B2 * | 1/2005 | Ozawa .............. | G21C 17/06 702/81 |
| 6,876,174 B1 | 4/2005 | Samittier Marti et al. | |
| 7,593,823 B2 | 9/2009 | Iwane et al. | |
| 7,639,021 B2 * | 12/2009 | Li ..................... | B60L 3/0023 322/99 |
| 7,759,901 B2 | 7/2010 | Hirsch et al. | |
| 8,129,996 B2 | 3/2012 | Iwane et al. | |
| 8,407,018 B2 * | 3/2013 | White ............... | G01R 31/3679 702/179 |
| 8,415,926 B2 | 4/2013 | Bhardwaj et al. | |
| 8,471,206 B1 * | 6/2013 | Kostrzewa ........ | G01J 5/045 250/340 |
| 9,063,018 B1 * | 6/2015 | Ghantous .......... | G01K 1/14 |
| 2013/0030738 A1 | 1/2013 | Milios | |
| 2013/0311115 A1 * | 11/2013 | Chaturvedi ....... | G01R 31/3637 702/63 |

FOREIGN PATENT DOCUMENTS

KR    10-0740114 B1    7/2007
KR    10-2013-0121143 A    11/2013

* cited by examiner

*Primary Examiner* — M'Baye Diao
(74) *Attorney, Agent, or Firm* — NSIP Law

(57) ABSTRACT

An apparatus for estimating a battery life includes a battery monitor configured to monitor an output signal from a battery; a steady state detector configured to detect a first steady state in which the output signal stays in a steady state and a second steady state differing from the first steady state; and an estimator configured to estimate a battery life from a variation of the output signal in a transient state in which the output signal transitions from the first steady state to the second steady state.

23 Claims, 12 Drawing Sheets

METHOD AND APPARATUS FOR ESTIMATING BATTERY LIFE DURING DRIVING OF ELECTRICAL VEHICLE (EV)

CROSS-REFERENCE TO RELATED APPLICATIONS

This application claims the benefit under 35 USC 119(a) of Korean Patent Application No. 10-2014-0047491 filed on Apr. 21, 2014, in the Korean Intellectual Property Office, the entire disclosure of which is incorporated herein by reference for all purposes.

BACKGROUND

1. Field

The following description relates to an apparatus and a method for estimating a state of a battery.

2. Description of Related Art

A battery in an electrical vehicle (EV) supplies power to the EV in a manner similar to an engine and a fuel tank of a vehicle using a fossil fuel, such as gasoline. Accordingly, the battery of the EV may be a significant indicator for estimating or predicting a fuel gauge and a distance-to-empty (DTE) that displays a distance travelable by a vehicle prior to a fuel supply being expended.

To estimate and predict such a battery state in the EV, an open circuit voltage table (OCVT) or modeling based on an electrochemical method may be used.

For example, the battery state may be estimated by measuring an internal impedance of the battery based on an electrochemical impedance spectroscopy (EIS) method. In this example, the estimation of the battery state of the EV based on the EIS method may be performed at a charging station or a laboratory provided with a device for charging and discharging the battery and EIS equipment.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for estimating a battery life includes a battery monitor configured to monitor an output signal from a battery; a steady state detector configured to detect a first steady state in which the output signal stays in a steady state and a second steady state differing from the first steady state; and an estimator configured to estimate a battery life from a variation of the output signal in a transient state in which the output signal transitions from the first steady state to the second steady state.

The steady state detector may be further configured to determine that the output signal is in the first steady state in response to the variation of the output signal staying within a predetermined threshold range.

The steady state detector may be further configured to determine that the output signal is in the first steady state in response to the variation of the output signal staying within a predetermined threshold range for a period of time exceeding a predetermined minimum period of time.

The steady state detector may be further configured to determine that the output signal is in the second steady state in response to the variation of the output signal staying within a predetermined threshold range after the output signal enters the transient state from the first steady state.

The steady state detector may be further configured to determine that the output signal is in the second steady state in response to the variation of the output signal staying within a predetermined threshold range for a period of time exceeding a predetermined minimum period of time after the output signal enters the transient state from the first steady state.

The estimator may be further configured to estimate the battery life from the variation of the output signal corresponding to the transient state in response to a period of time in which the output signal is in the transient state being less than a predetermined reference period of time.

The steady state detector may be further configured to determine that the output signal subsequent to the transient state is in the first steady state in response to a period of time in which the output signal is in the transient state being greater than or equal to a predetermined reference period of time.

The battery monitor may be further configured to monitor either one or both of a voltage signal output from the battery and a current signal output from the battery.

The estimator may be further configured to estimate an internal resistance of the battery from a variation of the voltage signal and a variation of the current signal in the transient state, and estimate a state of health (SoH) corresponding to the estimated internal resistance.

The estimator may be further configured to estimate the battery life during driving of an electrical vehicle (EV) in which the battery is installed.

In another general aspect, method of estimating a battery life includes monitoring an output signal from a battery; detecting a first steady state in which the output signal stays in a steady state; detecting a second steady state differing from the first steady state; and estimating a battery life from a variation of the output signal in a transient state in which the output signal transitions from the first steady state to the second steady state.

The detecting of the first steady state in which the output signal stays in the steady state may include determining that the output signal is in the first steady state in response to the variation of the output signal staying within a predetermined threshold range.

The detecting of the first steady state in which the output signal is maintained in the steady state may include determining that the output signal is in the first steady state in response to the variation of the output signal staying within a predetermined threshold range for a period of time exceeding a predetermined minimum period of time.

The detecting of the second steady state differing from the first steady state may include determining that the output signal is in the second steady state in response to the variation of the output signal staying within a predetermined threshold range after the output signal enters the transient state from the first steady state.

The detecting of the second steady state differing from the first steady state may include determining that the output signal is in the second steady state in response to the variation of the output signal staying within a predetermined threshold range for a period of time exceeding a predetermined minimum period of time after the output signal enters the transient state from the first steady state.

The estimating of the battery life from the variation of the output signal in the transient state in which the output signal transitions from the first steady state to the second steady state may include estimating the battery life from the variation of the output signal corresponding to the transient state in response to a period of time in which the output signal is in the transient state being less than a predetermined reference period time.

The method may further include determining that the output signal subsequent to the transient state is in the first steady state in response to a period of time in which the output signal is in the transient state being greater than or equal to a predetermined reference period of time.

The monitoring of the output signal from the battery may include monitoring either one or both of a voltage signal output from the battery and a current signal output from the battery.

The estimating of the battery life from the variation of the output signal in the transient state in which the output signal transitions from the first steady state to the second steady state may include estimating an internal resistance of the battery from a variation of the voltage signal and a variation of the current signal in the transient state, and estimating a state of health (SoH) corresponding to the estimated internal resistance.

In another general aspect, a non-transitory computer-readable storage medium stores a program including instructions to control a computer to perform the method described above.

In another general aspect, an apparatus for estimating a battery life includes a battery monitor configured to monitor a voltage signal and a current signal output from a battery; a detector configured to detect a change in the voltage signal and a change in the current signal between a first point in time at which the current signal departs from a first current range after remaining in the first current range for at least a first minimum period of time and a second point in time at which the current signal enters a second current range in which the current signal remains for at least a second minimum period of time; and an estimator configured to estimate a battery life of the battery based on the change in the voltage signal and the change in the current signal.

The estimator may be further configured to estimate an internal resistance of the battery by dividing the change in the voltage signal by the change in the current signal, and estimate the battery life of the battery based on the internal resistance.

The battery monitor, the detector, and the estimator may be implemented by at least one processor.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

As used herein, the term "battery life" refers to a remaining capacity of a battery, also referred to as a state of health (SoH). In one example, the SoH is represented by the following Equation 1, in which a current resistance denotes a current value of an internal resistance of a battery, and an initial resistance denotes an initial value of an internal resistance of the battery.

$$SoH = \left(\frac{\text{Current Resistance}}{\text{Initial Resistance}}\right)^{-1} \quad \text{[Equation 1]}$$

For example, a resistance and a capacity of a battery may be degraded due to an environment or a period of use, thus decreasing an available capacity or increasing a resistance. Due to such degradation of the resistance and the capacity, the SoH declines when compared to an initial battery manufacture state. In this example, the decline of the battery SoH indicates that an internal resistance of the battery differs from the initial battery manufacture state. Accordingly, a battery life, for example, the SoH, may be estimated by estimating the internal resistance of the battery.

Figure 1:
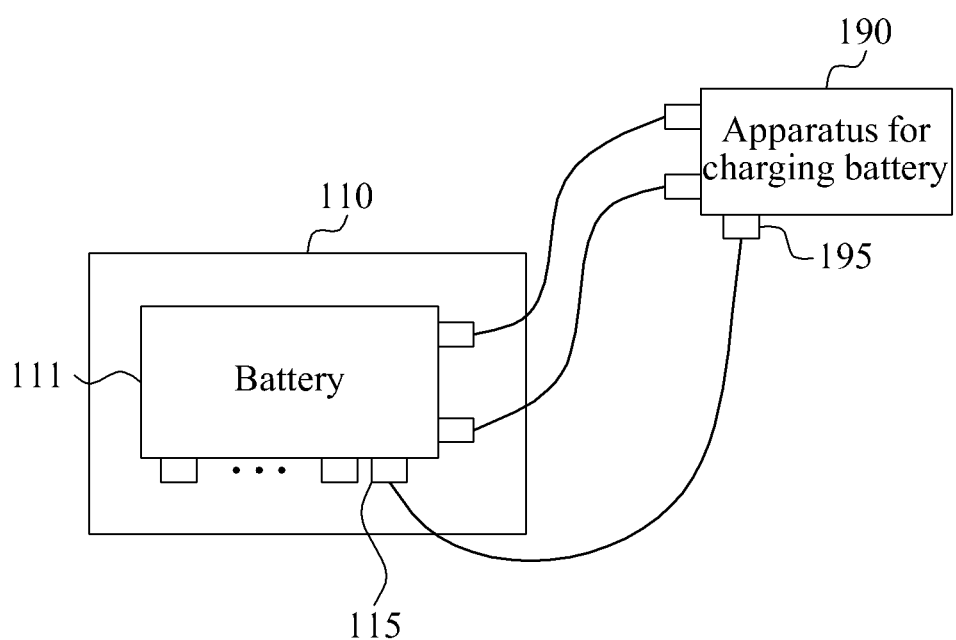
FIG. 1 illustrates an example of a structure in which a battery and an external apparatus for charging a battery are connected to estimate a state of function (SoF) of the battery based on an electrochemical impedance spectroscopy (EIS) method.

FIG. 1 illustrates an example of a structure in which a battery 111 and an external apparatus 190 for charging a battery are connected to estimate a state of function (SoF) of the battery 111 based on an electrochemical impedance spectroscopy (EIS) method.

As used herein, the term "SoF" refers to an indicator for a state of a battery, including, for example, an SoH or a state of charge (SoC).

Referring to FIG. 1, the EIS method conducts an experiment to test a capacity, a life, or a function of the battery 111 in various manners by adjusting environmental conditions in a laboratory. For example, the EIS method includes estimating an internal resistance value by inputting, by the external apparatus 190 for charging the battery, a current corresponding to a profile provided to the battery 111, or discharging an electric charge stored in the battery 111.

In the EIS method, the external apparatus 190 for charging the battery applies an EIS signal to the battery 111, and estimates an impedance based on a response to the EIS signal. For example, the response to the EIS signal of the battery 111 uses dedicated communication channels 115 and 195 for sensing, or a standard protocol between the external apparatus 190 for charging the battery and a battery management system (BMS).

As previously described, a battery state, for example, an SoF, of an electrical vehicle (EV) 110 is estimated based on the EIS method. For example, the EV 110 is driven to an external charging station provided with EIS equipment to obtain the battery state of the EV 110. However, driving the EV 110 to estimate the battery state may be inconvenient for a user.

In the EIS method, a time for stabilizing the battery 111 is required to estimate the battery state. In general, the battery state is estimated in a stable state of the battery 111. For example, when internal materials of the battery 111 are stabilized, greater precision may be achieved in estimating a value of the battery state. However, battery energy is consumed when the EV 110 is driven to the external charging station, thus requiring a relatively long period of standby time, for example, thirty minutes, while the battery is in an idle state until the battery state is stabilized subsequent to the driving.

Figure 2:
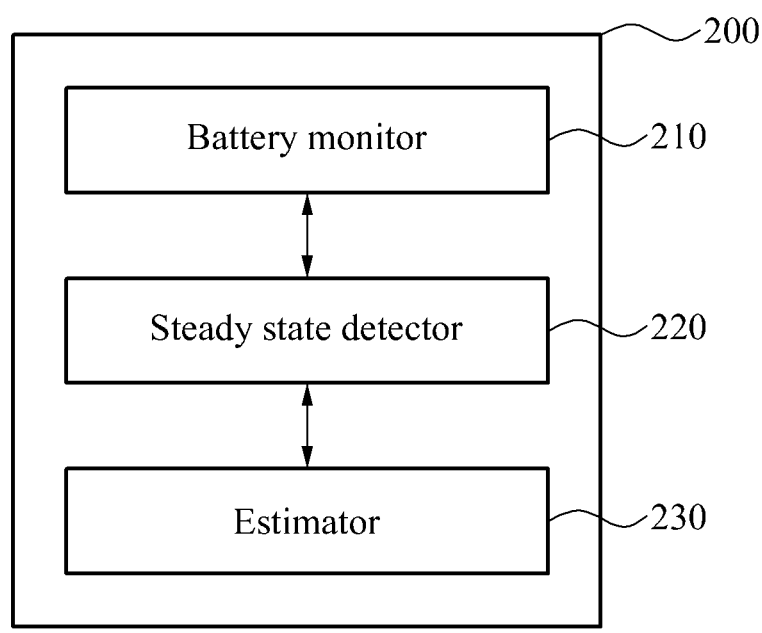
FIG. 2 illustrates an example of a configuration of an apparatus for estimating a battery life.

FIG. 2 illustrates an example of a configuration of an apparatus 200 for estimating a battery life.

Referring to FIG. 2, the apparatus 200 for estimating the battery life includes a battery monitor 210, a steady state detector 220, and an estimator 230.

The battery monitor 210 monitors a signal output from a battery. For example, the output signal includes a voltage signal and a current signal output from the battery. The battery monitor 210 continuously monitors an intensity variation of the output signal of the battery. Examples of the intensity variation of the output signal are illustrated in FIGS. 6 through 11.

The steady state detector 220 detects a first steady state in which the output signal stays in a steady state and a second steady state differing from the first steady state. In one example, the first steady state is a state in which the output signal stays in a predetermined threshold range for a period of time exceeding a predetermined minimum period of time. In another example, the second steady state is a state in which the output signal stays in a predetermined threshold range for a period of time exceeding a predetermined minimum period of time after the output signal enters a transient state from the first steady state.

The estimator 230 estimates a battery life from a variation of the output signal in a transient state in which the output signal transitions from the first steady state to the second steady state. For example, the battery life is estimated from the SoH. The SoH is a value estimated from a ratio of an initial value of an internal resistance to a current value of the internal resistance as expressed by Equation 1 described above. In one example, the estimator 230 estimates the current value of the internal resistance based on Ohm's law from the variation of the output signal, for example, a voltage variation and a current variation, in the transient state. By way of example, the internal resistance is estimated based on Equation 4 described below.

As used herein, the term "transient state" refers to a state in which the output signal transitions from the first steady state to the second steady state. For example, an interval in which the output signal is in the transient state is an interval from an end of the first steady state to a start of the second steady state. The transient state occurs in intervals between steady states. In the transient state, transition of the output signal may occur.

In one example, a BMS provided in an EV includes the apparatus 200 for estimating the battery life. For example, the EV may include a hybrid vehicle or a plug-in hybrid electric vehicle (PHEV).

The BMS in the EV monitors a state of a battery. For example, the apparatus 200 for estimating the battery life to the BMS may be implemented on a single chip. By way of example, a BMS provided with a general purpose processor may be implemented by a software program.

The apparatus 200 for estimating the battery life may also be applied to a BMS of an energy storage system (ESS) in addition to the EV.

The apparatus 200 for estimating the battery life provided in the EV estimates a battery state, for example, an SoH, during driving of the EV. For example, the apparatus 200 for estimating the battery life enables the EV to examine the battery state of the EV to provide convenience equal to or superior to a user experience (UX). Through this, the apparatus 200 for estimating the battery life may provide convenience with respect to the battery of the EV in a manner similar to a fuel gauge of a conventional gasoline vehicle.

For example, the apparatus 200 for estimating the battery life estimates the battery state, including an SoC, an SoH, and an SoF, by monitoring the output signal of the battery during driving of the EV. Accordingly, a user may not need to experience the inconvenience of driving the EV to an external charging station or a laboratory to bring the battery state up-to-date.

Figure 3:
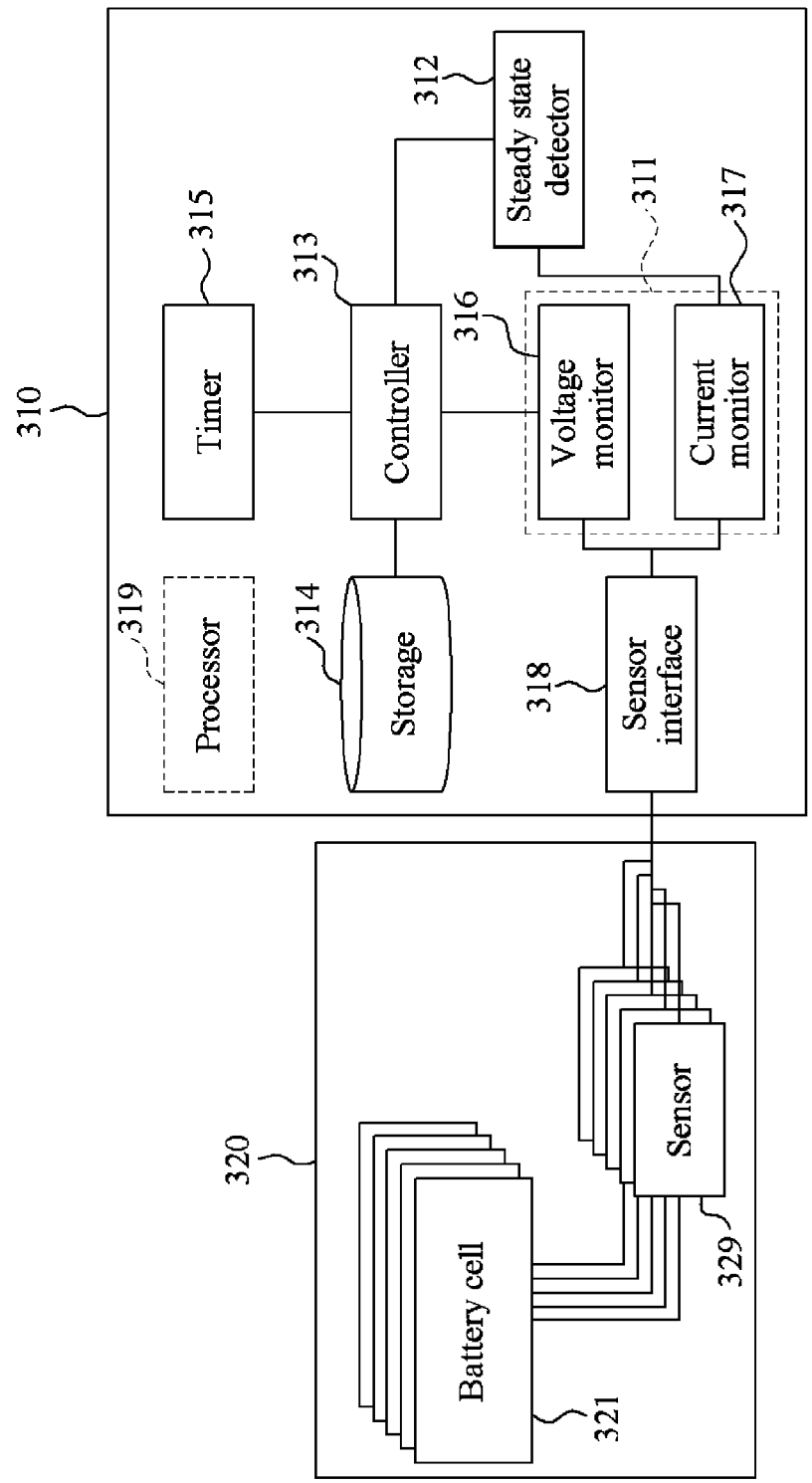
FIG. 3 illustrates an example of a configuration of a battery pack and an apparatus for estimating a battery life.

FIG. 3 illustrates an example of a configuration of a battery pack 320 and an apparatus 310 for estimating a battery life.

Referring to FIG. 3, the battery pack 320 includes a plurality of battery cells 321. For example, the battery back 320 may be used in an EV or a hybrid vehicle. In this example, a sensor 329 is attached to each of the battery cells 321. Each sensor 329 measures a voltage, a current, and a temperature of the battery cell 321 to which it is attached. Hereinafter, the battery pack 320 is also referred to as a battery.

The apparatus 310 for estimating the battery life includes a battery monitor 311, a steady state detector 312, a controller 313, a storage 314, a timer 315, and a sensor interface 318.

The sensor interface 318 transfers the voltage, the current, and the temperature of the battery cells 321 measured by the sensors 329 to the apparatus 310 for estimating the battery life.

The battery monitor 311 includes a voltage monitor 316 to monitor a voltage received via the sensor interface 318, and a current monitor 317 to monitor a current received via the sensor interface 318. For example, the current monitor 317 monitors a current value discharged from the battery.

The steady state detector 312 determines that an output signal is in a steady state when the output signal of the battery monitored in the battery monitor 311 stays in a predetermined threshold range. For example, the steady state detector 312 detects that a current signal is in a steady state when a variation of the current signal monitored in real time by the current monitor 317 stays in a predetermined threshold range for a period of time exceeding a predetermined minimum period of time. By way of example, the variation of the output signal and the predetermined threshold value are represented by the following Equations 2 and 3.

$$|V_{MAX} - V_{MIN}| \leq \alpha \qquad \text{[Equation 2]}$$

$$|I_{MAX} - I_{MIN}| \leq \beta \qquad \text{[Equation 3]}$$

In Equation 2, $V_{MAX}$ denotes a maximum voltage value, $V_{MIN}$ denotes a minimum voltage value, and $\alpha$ denotes a predetermined threshold range with respect to a voltage value during a predetermined interval, for example, a T time interval, in which a voltage is determined to be in a steady state. In Equation 3, $I_{MAX}$ denotes a maximum current value, $I_{MIN}$ denotes a minimum current value, and β denotes a predetermined threshold value with respect to a current value during a predetermined interval, for example, a T time interval, in which a current is determined to be in a steady state.

In this example, $V_{MAX}$, $V_{MIN}$, $I_{MAX}$, and $I_{MIN}$ are set differently for each of a first steady state and a second steady state. However, α and β are set identically for each of the first steady state and the second steady state. Further detailed descriptions will be provided with reference to FIGS. 6 through 11.

The controller 313 includes the estimator 230 of FIG. 2. For example, the controller 313 determines whether an interval between steady states, for example, an interval in which an output signal is in a transient state, is less than a predetermined reference period of time when at least two steady states, for example, the first steady state and the second steady state, are detected successively by the steady state detector 312 with respect to a current. As represented by the following Equation 4, the controller 313 estimates an internal resistance of the battery using a current variation and a voltage variation corresponding to the interval between the steady states when the interval between the steady states is less than the reference period of time.

$$R_t = \frac{\Delta V}{\Delta I} \quad \text{[Equation 4]}$$

In Equation 4, $R_t$ denotes a current value of the internal resistance of the battery. ΔV denotes the voltage variation during an interval in which the first steady state transitions to the second steady state. ΔI denotes the current variation during the interval in which the first steady state transitions to the second steady state. ΔV and ΔI each denote a variation of the output signal in the transient state, also represented by a signal variation of a voltage and a signal variation of a current each corresponding to the transient state.

The controller 313 determines a final steady state detected by the steady state detector 312 to be the first steady state when the interval between the steady states is greater than or equal to the reference period of time.

The storage 314 stores the internal resistance of the battery estimated by the controller 313. For example, the storage 314 stores the internal resistance of the battery along with an estimated point in time. The stored internal resistance of the battery may be utilized for estimating a change in a battery state, for example, an SoH, an SoF, and an SoC. By way of example, the storage 314 stores a history of the SoH.

The timer 315 provides a clock frequency to operate the controller 313. For example, the timer 315 provides clock information.

The apparatus 310 for estimating the battery life may include a processor 319 that may be used to implement any one or any combination of the battery monitor 311, the steady state detector 312, the controller 313, the storage 314, the timer 315, the voltage monitor 316, the current monitor 317, and the sensor interface 318. The processor 319 may execute instructions to cause the processor to perform the operations performed by any one or any combination of the battery monitor 311, the steady state detector 312, the controller 313, the storage 314, the timer 315, the voltage monitor 316, the current monitor 317, and the sensor interface 318. Although FIG. 3 shows one processor 319, the apparatus 310 for estimating the battery life may include a plurality of processors that may be used to implement any one or any combination of the battery monitor 311, the steady state detector 312, the controller 313, the storage 314, the timer 315, the voltage monitor 316, the current monitor 317, and the sensor interface 318.

Figure 4:
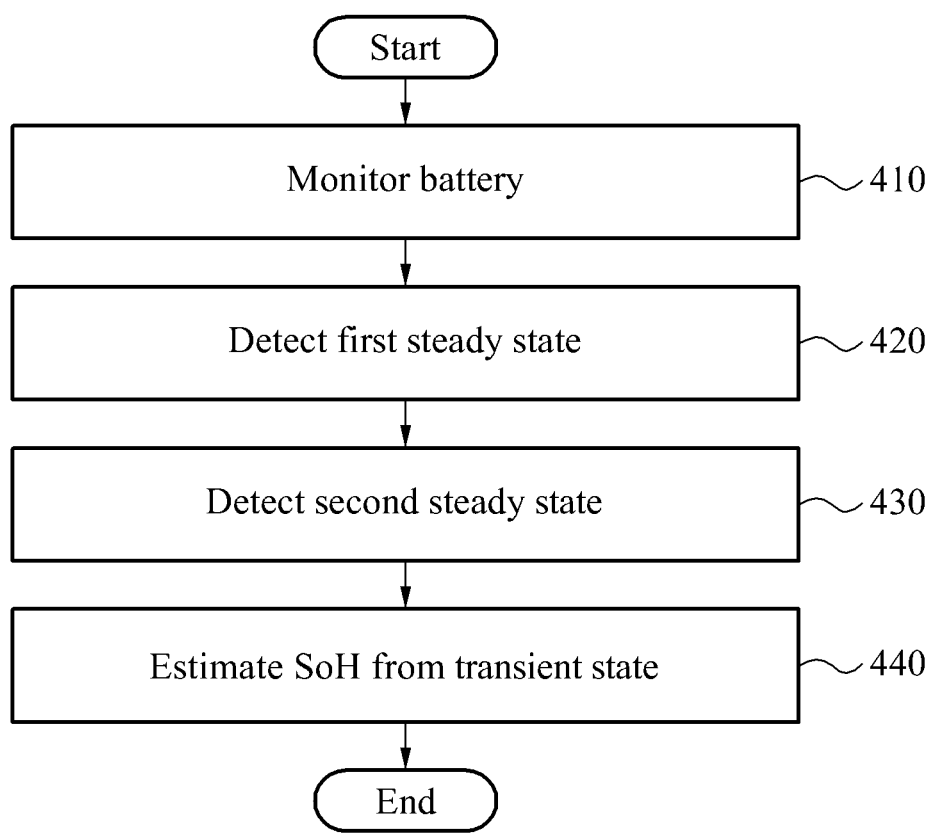
FIGS. 4 and 5 illustrate examples of a method of estimating a battery life.
Figure 5:
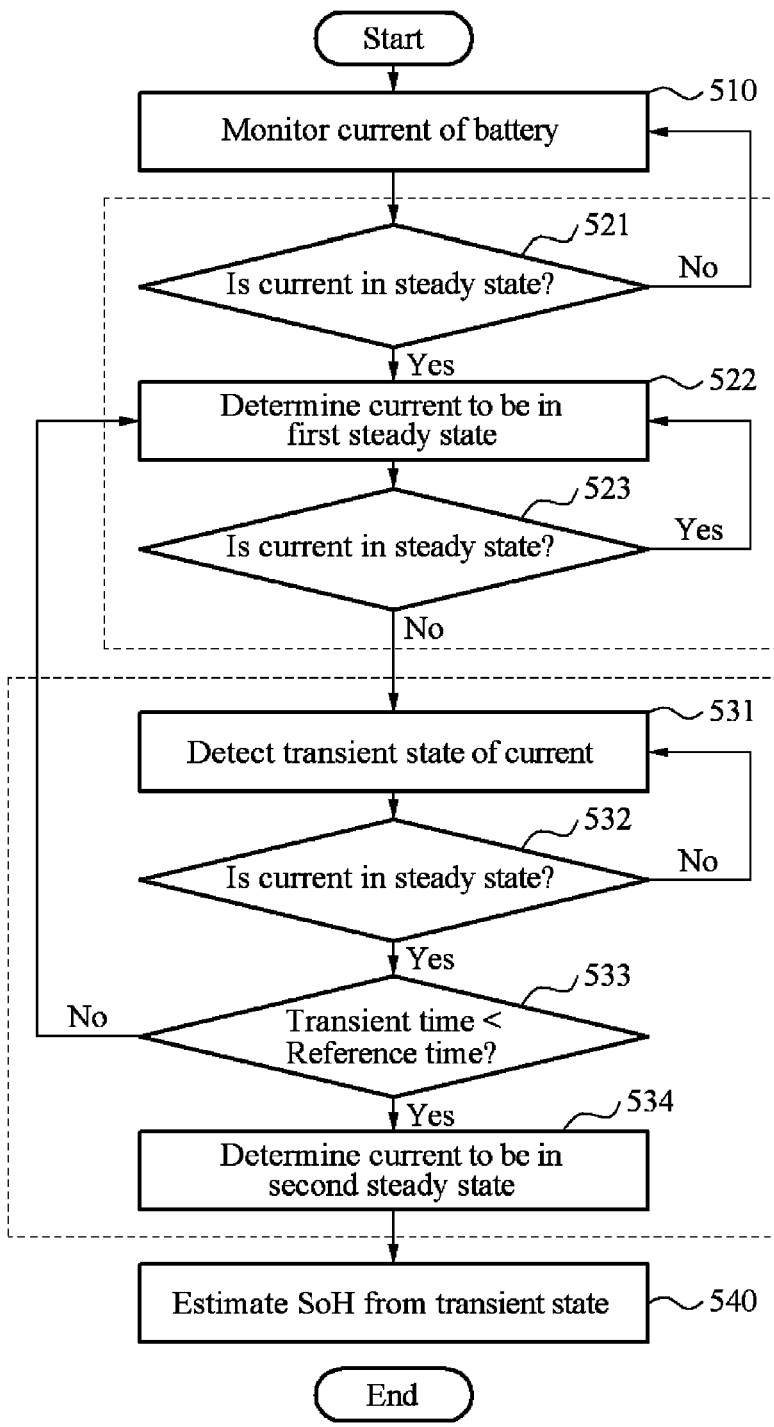

FIGS. 4 and 5 illustrate examples of a method of estimating a battery life.

FIG. 4 illustrates an overview of an example of the method of estimating the battery life.

In 410, a battery monitor monitors a battery. For example, the battery monitor monitors a signal output from the battery. The battery monitor monitors a signal corresponding to either one or both of a voltage and a current output from the battery.

In 420, a steady state detector detects a first steady state. For example, the steady state detector determines that the output signal is in the first steady state when a variation of the output signal stays in a predetermined threshold range. The steady state detector determines that the output signal is in the first steady state when the variation of the output signal stays in a predetermined threshold range for a period of time exceeding a predetermined minimum period of time.

In 430, the steady state detector detects a second steady state. For example, the steady state detector determines that the output signal is in the second steady state when a variation of the output signal stays in a predetermined threshold range after the output signal enters a transient state from the first steady state. The steady state detector determines that the output signal is in the second steady state when the variation of the output signal stays in a predetermined threshold range for a period of time exceeding a predetermined minimum period of time after the output signal enters the transient state from the first steady state.

In 440, an estimator estimates an SoH from a transient state. The estimator estimates a battery life from a variation of the output signal in the transient state in which the output signal transitions from the first steady state to the second steady state. For example, when an interval in which the output signal is in the transient state is less than a predetermined reference period of time, the estimator determines that the output signal prior to the interval is in the first steady state and the output signal subsequent to the interval is in the second steady state. When the interval in which the output signal is in the transient state is greater than or equal to the predetermined reference period of time, the estimator determines that the output signal subsequent to the transient state is in the first steady state.

FIG. 5 illustrates a detailed example of the method of estimating the battery life.

In 510, a battery monitor monitors a battery. For example, the battery monitor monitors a current of the battery input as a time series from a current monitor.

In 521, a steady state detector determines whether the current of the battery is in a steady state. For example, the steady state detector determines whether a variation of an output signal monitored in the battery monitor stays in a predetermined threshold range. The battery monitor monitors the current of the battery until the steady state is detected by the steady state detector.

In 522, the steady state detector determines that the current of the battery is in the first steady state when the current of the battery is in the steady state. For example, the steady state detector determines that the current is in the first steady state when a period of time in which a variation of the current of the battery stays in a predetermined threshold range is sufficiently long. By way of example, the steady state detector determines that the current is in the first steady state when the period of time in which the variation of the current stays in the predetermined threshold range is greater than a predetermined minimum period of time.

In 523, the steady state detector continuously determines whether the current of the battery is in the steady state. For example, when the current of the battery is continuously in the steady state, the steady state detector determines that the current stays in the first steady state.

In 531, the steady state detector detects a transient state of the current. For example, the steady state detector determines that the output signal is in a transient state when the output signal, for example, the current, of the battery deviates from a predetermined threshold range. As used herein, the term "transient state" refers to a state in which the output signal transitions to a steady state. For example, when the battery is provided in an EV, the output signal, for example, the current, of the battery may iterate the steady state and the transient state in an alternating manner.

In 532, the steady state detector determines whether the current is in the steady state after the current enters the transient state from the first steady state. For example, the steady state detector determines that the current is in the steady state when the current stays in a predetermined threshold range for a period of time exceeding a predetermined minimum period of time after the current enters the transient state from the first steady state.

In 533, a controller determines whether a transient period of time is less than a reference period of time. As used herein, the term "transient period of time" refers to a period of time in which the output signal is in a transient state. For example, the transient period of time is a period of time in which the output signal transitions from the first steady state to the second steady state.

In 534, the controller determines that the current determined to be in the steady state in 532 is in the second steady state when the transient period of time is less than the reference period of time. For example, the controller determines that the current in the steady state subsequent to an end of the transient state is in the second steady state. In contrast, the controller determines that the current determined to be in the steady state in 532 is in the first steady state when the transient period of time is greater than or equal to the reference period of time, and returns to 522.

In 540, an estimator estimates an SoH of the battery from the transient state. For example, the estimator estimates an internal resistance of the battery using a difference between a current value of the first steady state and a current value of the second steady state, and a difference between a voltage value of the first steady state and a voltage value of the second steady state. For example, the estimator estimates the internal resistance of the battery based on Equation 4. The estimated internal resistance may be employed in predicting information associated with an electric charge or a battery life.

Figure 6:
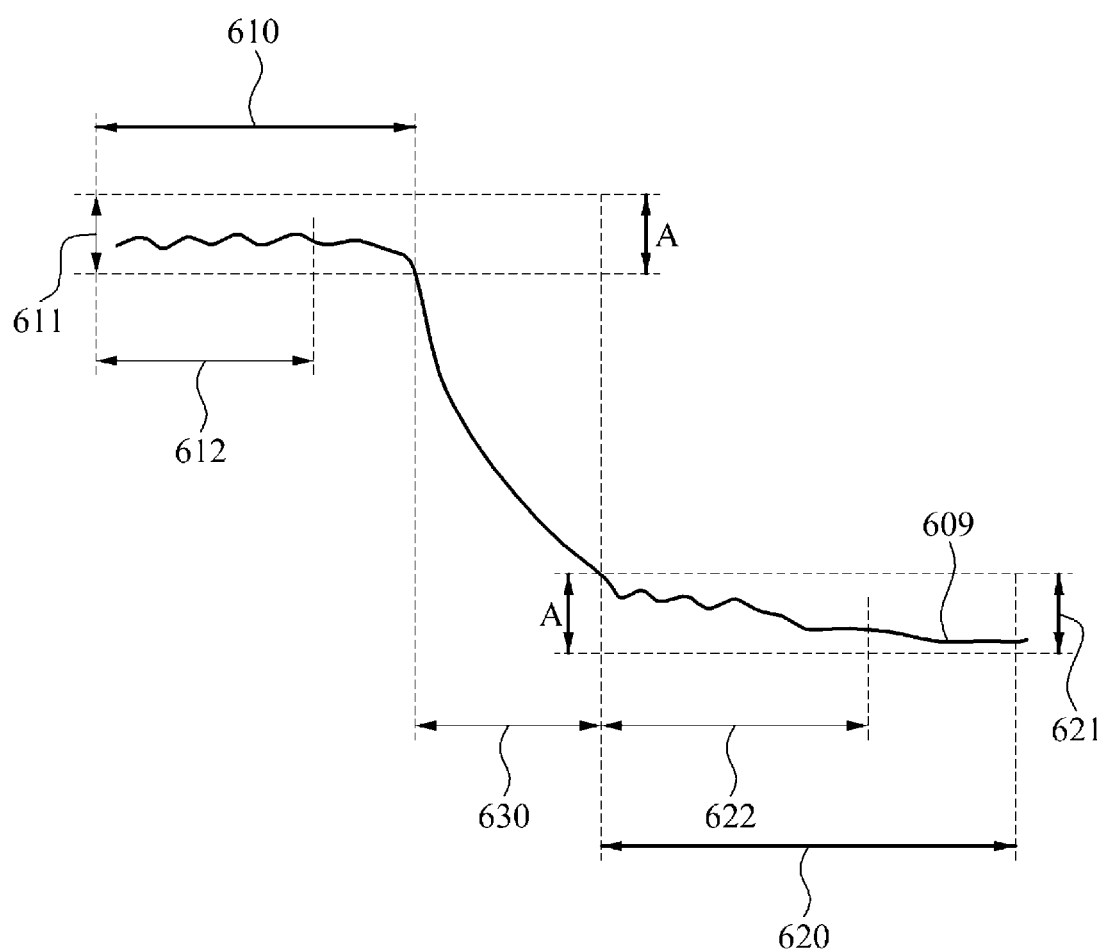
FIGS. 6 through 8 illustrate examples of a first steady state, a second steady state, and a transient state of a current and a voltage.
Figure 7:
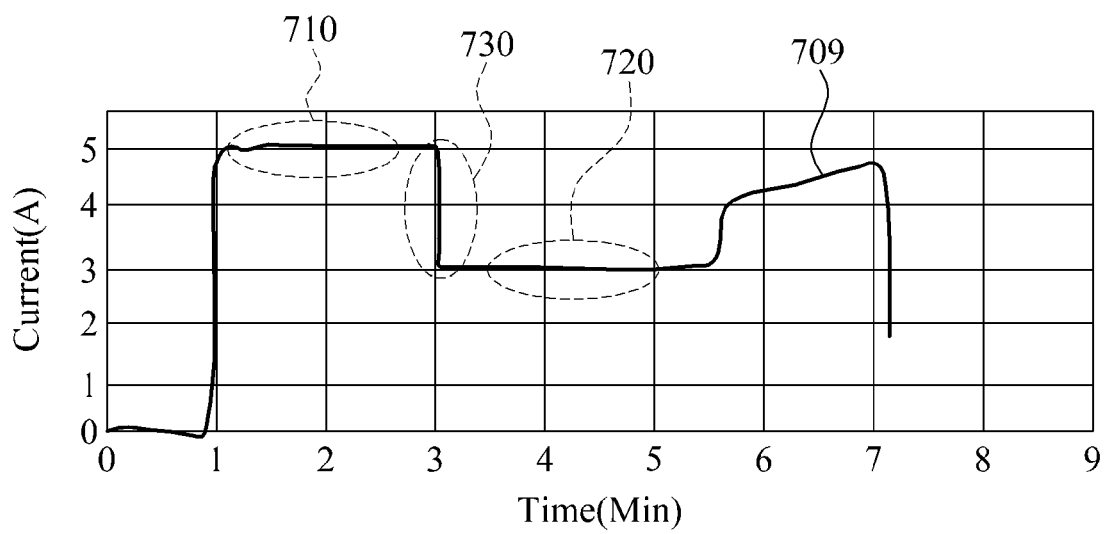
Figure 8:
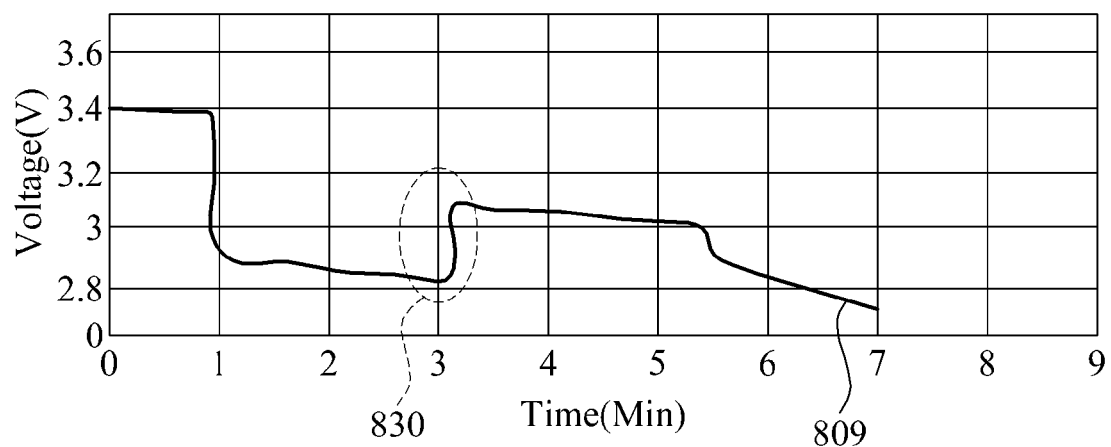

FIGS. 6 through 8 illustrate examples of a first steady state, a second steady state, and a transient state of a current and a voltage.

FIG. 6 illustrates examples of a first steady state 610, a second steady state 620, and a transient state 630 of an output signal 609.

For example, given a nature of driving an EV, an interval in which power of a battery is consumed in a steady state of an output signal of the battery may occur. Such a steady state interval detected from an entire driving pattern is as shown in FIG. 6.

The first steady state 610 is a state in which the output signal 609 stays in a first steady state range 611 for a period of time exceeding a first minimum period 612 of time. The second steady state 620 is a state in which the output signal 609 stays in a second steady state range 621 for a period of time exceeding a second minimum period 622 of time. For example, the first steady state range 611 and the second steady state range 621 have a same predetermined threshold range A as shown in FIG. 6. The first minimum period 612 of time and the second minimum period 622 of time have the same duration.

The transient state 630 is a state of the output signal 609 corresponding to an interval from an end of the first steady state 610 to a start of the second steady state 620. For example, when a length of the interval corresponding to the transient state 630 is less than a predetermined reference period of time, a controller, for example, an estimator, estimates an internal resistance of the battery from a current variation and a voltage variation in the transient state 630.

FIG. 7 illustrates examples of a first steady state 710, a second steady state 720, and a transient state 730 of a signal 709 corresponding to a current of a battery.

In FIG. 7, a controller determines the first steady state 710, the second steady state 720, and the transient state 730 of the signal 709 corresponding to the current in a manner similar to FIG. 6.

FIG. 8 illustrates examples of a transient state 830 of a signal 809 corresponding to a voltage of a battery.

For example, a first steady state, a second steady state, and the transient state 830 of the voltage may occur during intervals equal to intervals of the first steady state 710, the second steady state 720, and the transient state 730 of the current of FIG. 7 because the voltage corresponds to the current.

In FIG. 8, a controller determines the transient state 830 of the signal 809 corresponding to the voltage. For example, the controller determines the first steady state 710, the second steady state 720, and the transient state 730 from the signal 709 corresponding to the current of FIG. 7, and estimates an internal resistance of the battery from a current variation of the transient state 730 of FIG. 7 and a voltage variation of the transient state 830 of FIG. 8.

As previously described, the voltage gradually decreases with battery use when the current and the voltage of the EV are measured. In this example, the internal resistance of the battery is estimated from a current drop value, for example, a current variation, and a voltage drop value, for example, a voltage variation, present in the first steady state 710, the second steady state 720 in which the current is maintained for a predetermined period of time, and an interval between the first steady state 710 and the second steady state 720, for example, the transient state 730.

For example, a steady state detector determines that an interval in which an initial current value stays at approximately 5 amperes (A) is the first steady state, and an interval in which a new current value stays at approximately 3 A is the second steady state. A current variation for each of the two intervals is ΔI, and a voltage variation corresponding to the current variation is ΔV.

Figure 9:
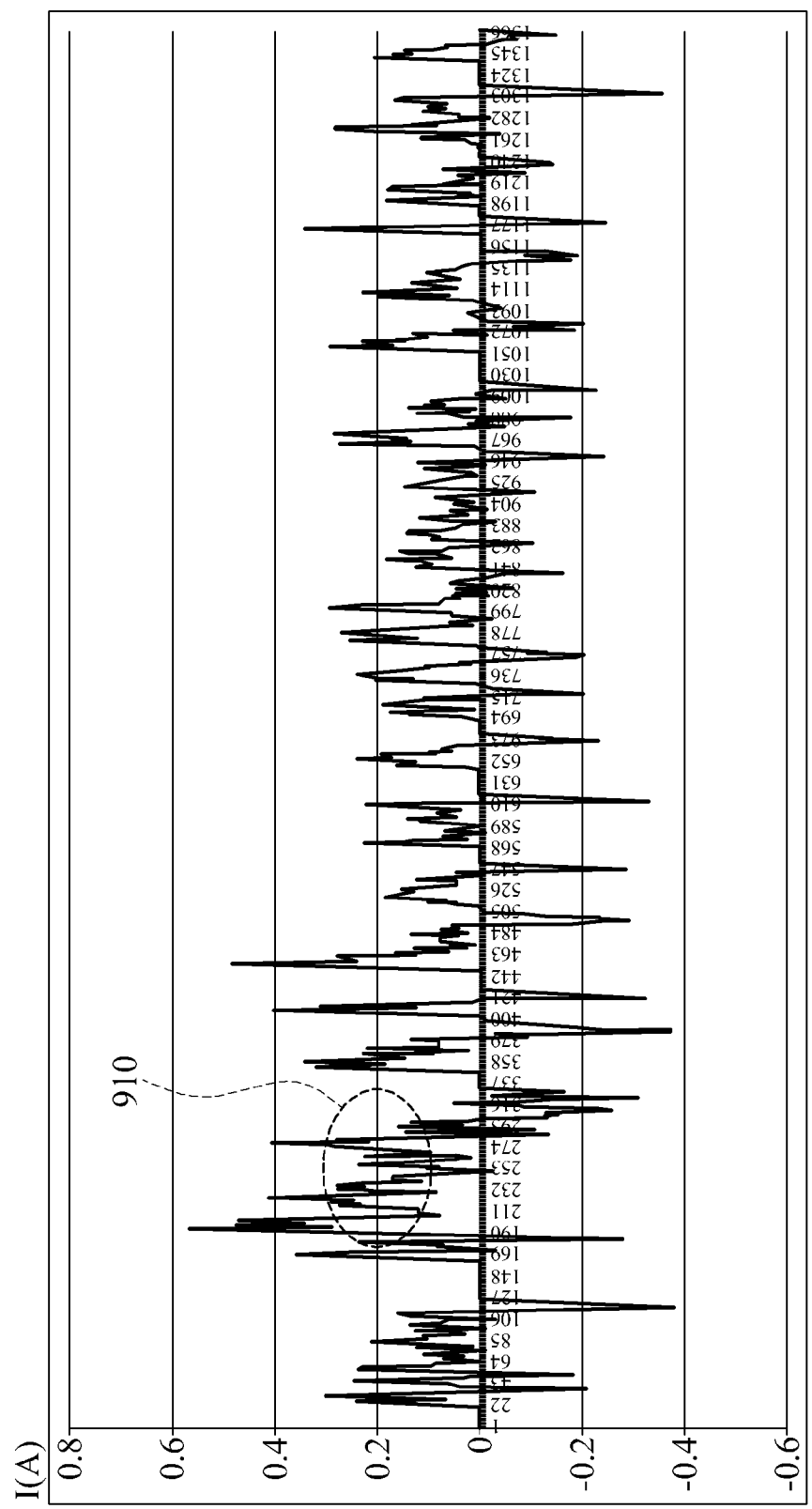
FIGS. 9 through 11 illustrate examples of a variation of a current and a voltage of a battery during driving of an electrical vehicle (EV).
Figure 10:
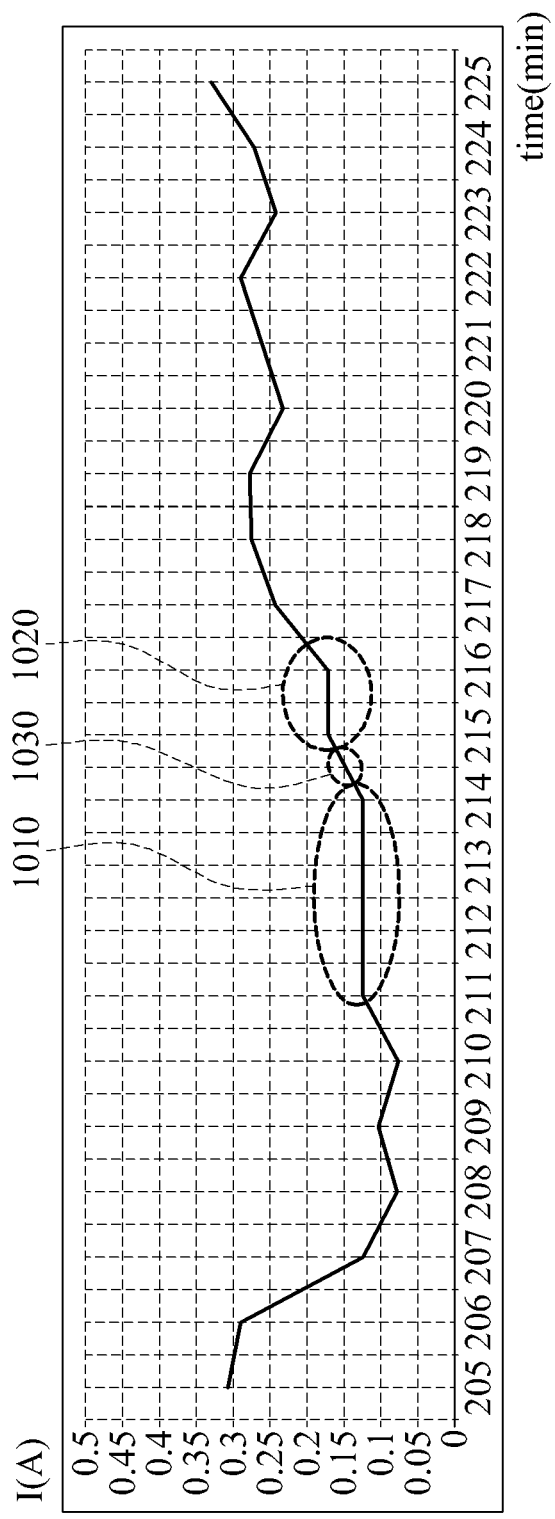
Figure 11:
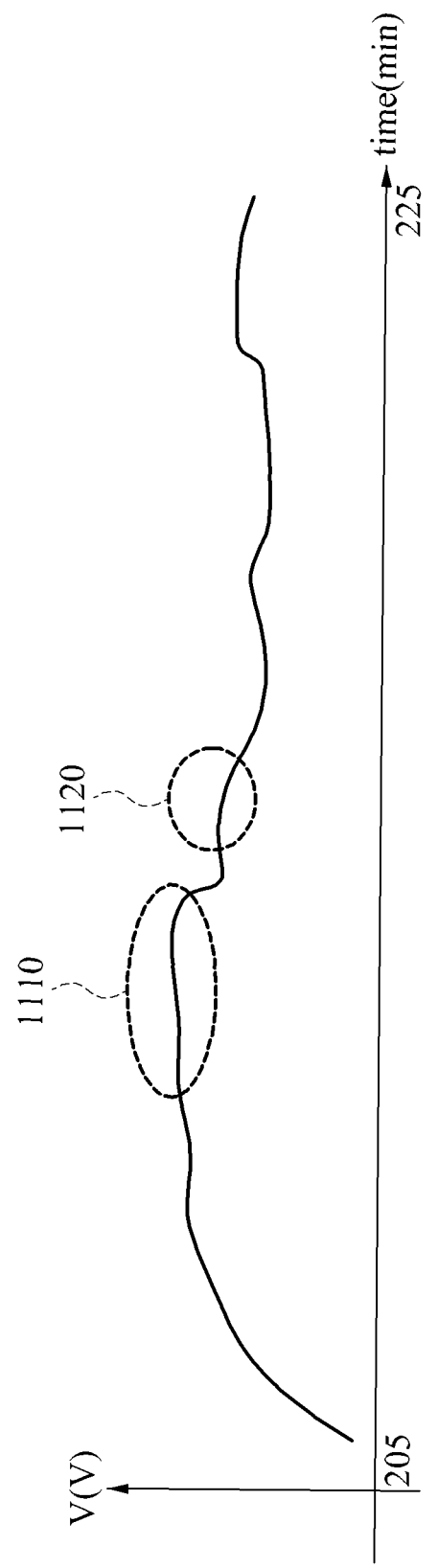

FIGS. 9 through 11 illustrate examples of a variation of a current and a voltage of a battery during driving of an EV.

FIG. 9 illustrates an example of an urban dynamometer driving schedule (UDDS) profiling an instance of a predetermined driver driving an EV.

Referring to FIG. 9, an output current of a battery changes based on patterns of accelerating and stopping of the EV by the driver. In this example, the UDDS profile may be obtained by converting a profile of a driver of a vehicle driven by an internal combustion engine to correspond to the EV. An extended view of a partial interval 910 of the UDDS profile is illustrated in FIG. 10.

FIG. 10 illustrates an example of a variation of a current corresponding to a partial driving interval of an EV.

Referring to FIG. 10, a controller determines a first steady state 1010 and a second steady state 1020 during the partial driving interval. For example, the controller calculates an SoH of a battery from a transient state 1030 between the first steady state 1010 and the second steady state 1020.

FIG. 11 illustrates an example of a variation of a voltage corresponding to a partial driving interval of an EV.

Referring to FIG. 11, the voltage corresponds to the variation of the current as shown in FIG. 10. For example, intervals in which the current is in the first steady state 1010 and the second steady state 1020 as shown in FIG. 10 correspond to intervals in which the voltage is in a first steady state 1110 and a second steady state 1120.

Figure 12:
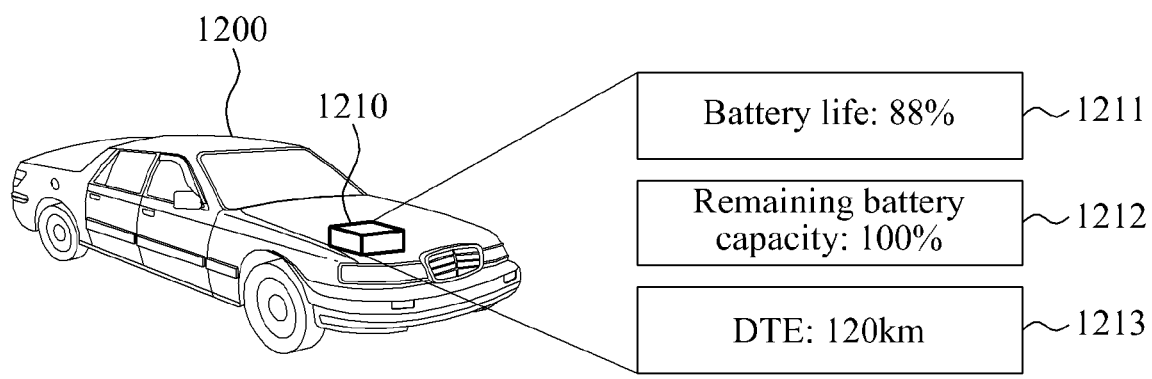
FIG. 12 illustrates an example of a battery life, a remaining battery capacity, and a distance-to-empty (DTE) in an EV.

FIG. 12 illustrates an example of a battery life 1211, a remaining battery capacity 1212, and a distance-to-empty (DTE) 1213 in an EV 1200.

For example, an apparatus for estimating a battery life automatically detects a steady state when a driver drives the EV 1200, and using the detected steady state, estimates an SoH of a battery 1210. The estimated SoH is displayed on a dashboard of the EV 1200 as the battery life 1211. The estimated SoH is used as an input to calculate the remaining battery capacity 1212, for example, an SoC. The estimated SoH is used to allow the EV 1200 to precisely calculate the DTE 1213.

The dashboard displays whether the battery 1210 needs a replacement based on the battery life 1211. The apparatus for estimating the battery life issues a warning to indicate battery related problems in advance. Accordingly, a user may be provided with a precise battery state, consequently creating a sense of psychological security. Since it is not necessary to perform additional actions for measuring the battery state, a travel time and a waiting time of the EV 1200 may be reduced, and the user may readily evaluate the battery state when a charging station is not readily available in early stages of supply of the EV 1200.

In one example, the battery state of the EV 1200 is estimated. For example, the apparatus for estimating the battery life does not need to be connected to an external charger to obtain various types of state information of the battery 1210. The apparatus for estimating the battery life does not require an idle period of time, for example, thirty minutes, until the battery 1210 enters a steady state. An inconvenience caused by the need to travel to an external charging station and waiting for the time required for measuring the battery state including the idle period of time required for the battery to reach a steady state may be eliminated by the apparatus for estimating the battery life, thus making operating the EV 1200 more convenient for the user.

Thus, the user, for example, the driver driving the EV 1200, is provided with a user experience (UX) similar to a UX of driving a gasoline vehicle. For example, the apparatus for estimating the battery life may update the battery state using up-to-date data obtained during driving of the EV 1200, providing a UX similar to a UX of driving a gasoline vehicle in which a fuel gauge is updated while driving the gasoline vehicle.

The battery monitor 210, the steady state detector 220, and the estimator 230 in FIG. 2 and the battery monitor 311, the steady state detector 312, the controller 313, the storage 314, the timer 315, the voltage monitor 316, the current monitor 317, and the sensor interface 318 in FIG. 3 that perform the various operations described with respect to FIGS. 4-12 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for estimating a battery life, the apparatus comprising:
    a battery monitor configured to monitor an output signal from a battery;
    a steady state detector configured to detect a first steady state in which the output signal stays in a steady state and a second steady state differing from the first steady state; and
    an estimator configured to estimate a battery life from a variation of the output signal in a transient state in which the output signal transitions from the first steady state to the second steady state.

2. The apparatus of claim 1, wherein the steady state detector is further configured to determine that the output signal is in the first steady state in response to the variation of the output signal staying within a predetermined threshold range.

3. The apparatus of claim 1, wherein the steady state detector is further configured to determine that the output signal is in the first steady state in response to the variation of the output signal staying within a predetermined threshold range for a period of time exceeding a predetermined minimum period of time.

4. The apparatus of claim 1, wherein the steady state detector is further configured to determine that the output signal is in the second steady state in response to the variation of the output signal staying within a predetermined threshold range after the output signal enters the transient state from the first steady state.

5. The apparatus of claim 1, wherein the steady state detector is further configured to determine that the output signal is in the second steady state in response to the variation of the output signal staying within a predetermined threshold range for a period of time exceeding a predetermined minimum period of time after the output signal enters the transient state from the first steady state.

6. The apparatus of claim 1, wherein the estimator is further configured to estimate the battery life from the variation of the output signal corresponding to the transient state in response to a period of time in which the output signal is in the transient state being less than a predetermined reference period of time.

7. The apparatus of claim 1, wherein the steady state detector is further configured to determine that the output signal subsequent to the transient state is in the first steady state in response to a period of time in which the output signal is in the transient state being greater than or equal to a predetermined reference period of time.

8. The apparatus of claim 1, wherein the battery monitor is further configured to monitor either one or both of a voltage signal output from the battery and a current signal output from the battery.

9. The apparatus of claim 8, wherein the estimator is further configured to estimate an internal resistance of the battery from a variation of the voltage signal and a variation of the current signal in the transient state, and estimate a state of health (SoH) corresponding to the estimated internal resistance.

10. The apparatus of claim 1, wherein the estimator is further configured to estimate the battery life during driving of an electrical vehicle (EV) in which the battery is installed.

11. A method of estimating a battery life, the method comprising:
    monitoring an output signal from a battery;

detecting, using a steady state detector, a first steady state in which the output signal stays in a steady state and a second steady state differing from the first steady state; and estimating, using one or more processors, a battery life from a variation of the output signal in a transient state in which the output signal transitions from the first steady state to the second steady state.

12. The method of claim 11, wherein the detecting of the first steady state in which the output signal stays in the steady state comprises determining that the output signal is in the first steady state in response to the variation of the output signal staying within a predetermined threshold range.

13. The method of claim 11, wherein the detecting of the first steady state in which the output signal is maintained in the steady state comprises determining that the output signal is in the first steady state in response to the variation of the output signal staying within a predetermined threshold range for a period of time exceeding a predetermined minimum period of time.

14. The method of claim 11, wherein the detecting of the second steady state differing from the first steady state comprises determining that the output signal is in the second steady state in response to the variation of the output signal staying within a predetermined threshold range after the output signal enters the transient state from the first steady state.

15. The method of claim 11, wherein the detecting of the second steady state differing from the first steady state comprises determining that the output signal is in the second steady state in response to the variation of the output signal staying within a predetermined threshold range for a period of time exceeding a predetermined minimum period of time after the output signal enters the transient state from the first steady state.

16. The method of claim 11, wherein the estimating of the battery life from the variation of the output signal in the transient state in which the output signal transitions from the first steady state to the second steady state comprises estimating the battery life from the variation of the output signal corresponding to the transient state in response to a period of time in which the output signal is in the transient state being less than a predetermined reference period time.

17. The method of claim 11, further comprising determining, using at least one of the one or more processors, that the output signal subsequent to the transient state is in the first steady state in response to a period of time in which the output signal is in the transient state being greater than or equal to a predetermined reference period of time.

18. The method of claim 11, wherein the monitoring of the output signal from the battery comprises monitoring either one or both of a voltage signal output from the battery and a current signal output from the battery.

19. The method of claim 18, wherein the estimating of the battery life from the variation of the output signal in the transient state in which the output signal transitions from the first steady state to the second steady state comprises estimating an internal resistance of the battery from a variation of the voltage signal and a variation of the current signal in the transient state, and estimating a state of health (SoH) corresponding to the estimated internal resistance.

20. A non-transitory computer-readable storage medium storing instructions that, when executed by a processor, cause the processor to perform the method of claim 11.

21. An apparatus for estimating a battery life, the apparatus comprising:
a battery monitor configured to monitor a voltage signal and a current signal output from a battery;
a detector configured to detect a change in the voltage signal and a change in the current signal between a first point in time at which the current signal departs from a first current range after remaining in the first current range for at least a first minimum period of time and a second point in time at which the current signal enters a second current range in which the current signal remains for at least a second minimum period of time; and
an estimator configured to estimate a battery life of the battery based on the change in the voltage signal and the change in the current signal.

22. The apparatus of claim 21, wherein the estimator is further configured to estimate an internal resistance of the battery by dividing the change in the voltage signal by the change in the current signal, and estimate the battery life of the battery based on the internal resistance.

23. The apparatus of claim 21, wherein the battery monitor, the detector, and the estimator are implemented by at least one processor.

* * * * *